United States Patent [19]

Rösler et al.

[11] 4,403,334

[45] Sep. 6, 1983

[54] MONOLITHICALLY INTEGRABLE SEMICONDUCTOR CIRCUIT

[75] Inventors: Helmut Rösler, Munich; Reinhard Gafert, Penzberg, both of Fed. Rep. of Germany

[73] Assignee: Siemens Aktiengesellschaft, Berlin and Munich, Fed. Rep. of Germany

[21] Appl. No.: 137,380

[22] Filed: Apr. 4, 1980

[30] Foreign Application Priority Data

Apr. 10, 1979 [DE] Fed. Rep. of Germany ....... 2914518

[51] Int. Cl.[3] .............................................. H03K 23/00

[52] U.S. Cl. ........................................ 377/44; 377/46; 377/64

[58] Field of Search ......... 235/92 SH, 92 CC, 92 CT, 235/92 DP; 84/1.01, 1.03; 328/37, 43, 48; 307/260

[56] References Cited

U.S. PATENT DOCUMENTS 3,716,725 2/1973 Freeman ................................ 328/43
4,019,417 4/1977 Carlson ................................ 84/1.01
4,099,048 7/1978 Eichenlaub ................... 235/92 DM
4,282,786 8/1981 Deutsch ................................ 84/1.01
4,300,430 11/1981 Bione et al. ......................... 84/1.01

*Primary Examiner*—Gary Chin
*Attorney, Agent, or Firm*—Herbert L. Lerner; Laurence A. Greenberg

[57] ABSTRACT

A monolithically integrable semiconductor circuit having an input section into which respective electrical signals which are to be evaluated and which have been provided by groups of binary pulses are serially feedable, includes a clock-controlled shift register in the input section, the shift register being operable by shift pulses from the controlling clock thereof. The shift register has a plurality of register cells corresponding in number at least to the number of binary digits of the groups of binary pulses. The semiconductor circuit also includes a logic circuit, at least two of the register cells having an output operatively connected to the logic circuit for controlling the logic circuit. A pulse counter is driven by the shift pulses as counting pulses, the logic circuit having an output operatively connected to the pulse counter for fixing the count thereof, and at least one other circuit component is controllable by the count of the pulse counter respectively fixed by the control of the logic circuit.

21 Claims, 4 Drawing Figures

MONOLITHICALLY INTEGRABLE SEMICONDUCTOR CIRCUIT

BACKGROUND OF THE INVENTION

The invention relates to a monolithically integrable semiconductor circuit with a clock-controlled shift register which serves to interpret or evaluate electrical signals formed of groups of binary pulses.

It is an object of the invention to provide such a monolithically integrable semiconductor circuit or system having a signal input to which digital signals are fed which are checked automatically for the presence of flag or characteristic patterns stored in the circuit or system and then are used further, depending upon the outcome of the check. Provision is made, if the outcome of the check is positive, for regeneration or reproduction of the signal intended for interpretation or evaluation in accordance with the stored patterns and the recognized flag or characteristic. The device according to the invention as described hereinafter is suited according to the invention as described hereinafter is suited to perform these and other tasks.

SUMMARY OF THE INVENTION

According to the invention, the input section of this semiconductor circuit comprises by a clock-controlled shift register with a number of register cells matching at least the number of binary digits of the groups of binary pulses provided for the evaluation, and the output of at least two of these register cells is provided for the control of a logic circuit. In addition, the output of the logic circuit is provided for fixing the count of a pulse counter, to which the shifting signals provided for the operation of the shift register are fed as counting pulses. Finally, the pulse-counter count respectively fixed by the control of the logic circuit is provided for controlling at least one other circuit section and, in particular, to drive a write/read memory.

Such a semiconductor circuit can be applied, for example, to the signal control of electronic instruments, such as an electronic organ, for example. In such organs, for instance, the respective signal to be evaluated is produced or generated by actuation of the keyboard keys and passed on from there for evaluation or interpretation. Then, a semiconductor device according to the invention is provided for automatically generating or producing an accompaniment appropriate to the melody being played, the appropriate patterns for the accompaniment, which are controlled by the respectively fixed count and by appropriate selection circuits, being recalled from an appropriately programmed memory, such as a read-only memory.

The invention also has the following features:

A. The input section of the semiconductor circuit is supplemented by a ring shift register which precedes the hereinaforementioned shift register and is preferably controlled by the same clock controlling the shift register which is masked by the logic circuit and into which the respective electrical signals to be interpreted or evaluated, and given by the groups of binary pulses, are fed-in serially, and from which the components intended for further interpretation are finally transferred to the first-mentioned shift register in parallel operation.

B. The ring shift register is equipped with circuitry serving to suppress errors in the signals circulating therewithin.

C. The shift register controlling the logic circuit can also be constructed as a ring shift register and, if applicable, can be identical to the ring shift register mentioned under A above.

D. The count respectively fixed by the logic circuit is used to drive an arithmetic unit and is linked therethrough to other digital signals.

The automatic production of a melody accompaniment in an electronic organ requires automatic recognition of the respective existing playing status i.e. the recognition of the digital signals respectively obtained through the keyboard. It is desirable, for musical reasons, to have certain playing states, that is, certain combinations of depressed keys, exert no influence on the generation or production of the accompaniment. Such a case occurs, for example, when keys having associated tunes which are only half a tone apart are actuated simultaneously.

Other features which are considered as characteristic for the invention are set forth in the appended claims. Although the invention is illustrated and described herein as embodied in a monolithically integrable semiconductor circuit, it is nevertheless not intended to be limited to the details shown, since various modifications and structural changes may be made therein without departing from the spirit of the invention and within the scope and range of equivalents of the claims.

BRIEF DESCRIPTION OF THE DRAWING

The construction and method of operation of the invention, however, together with additional objects and advantages thereof will be best understood from the following description of specific embodiments when read in connection with the accompanying drawings, in which.

DESCRIPTION OF THE PREFERRED EMBODIMENTS

Figure 1:
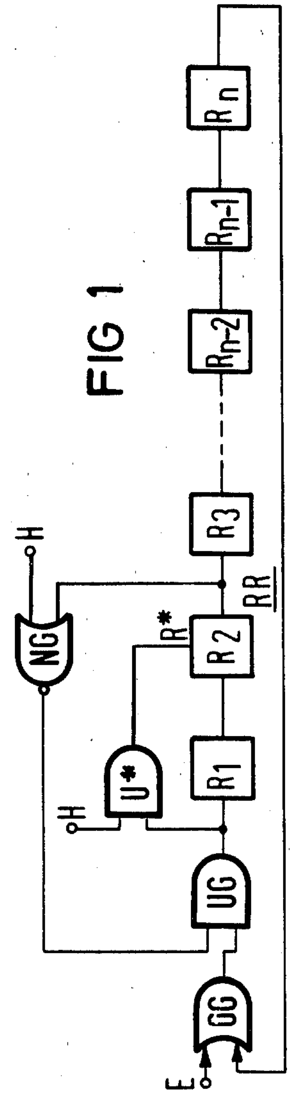
FIGS. 1 and 2 are block diagrams of input sections of a semiconductor circuit according to the invention, which are supplemented by a ring shift register.
Figure 2:
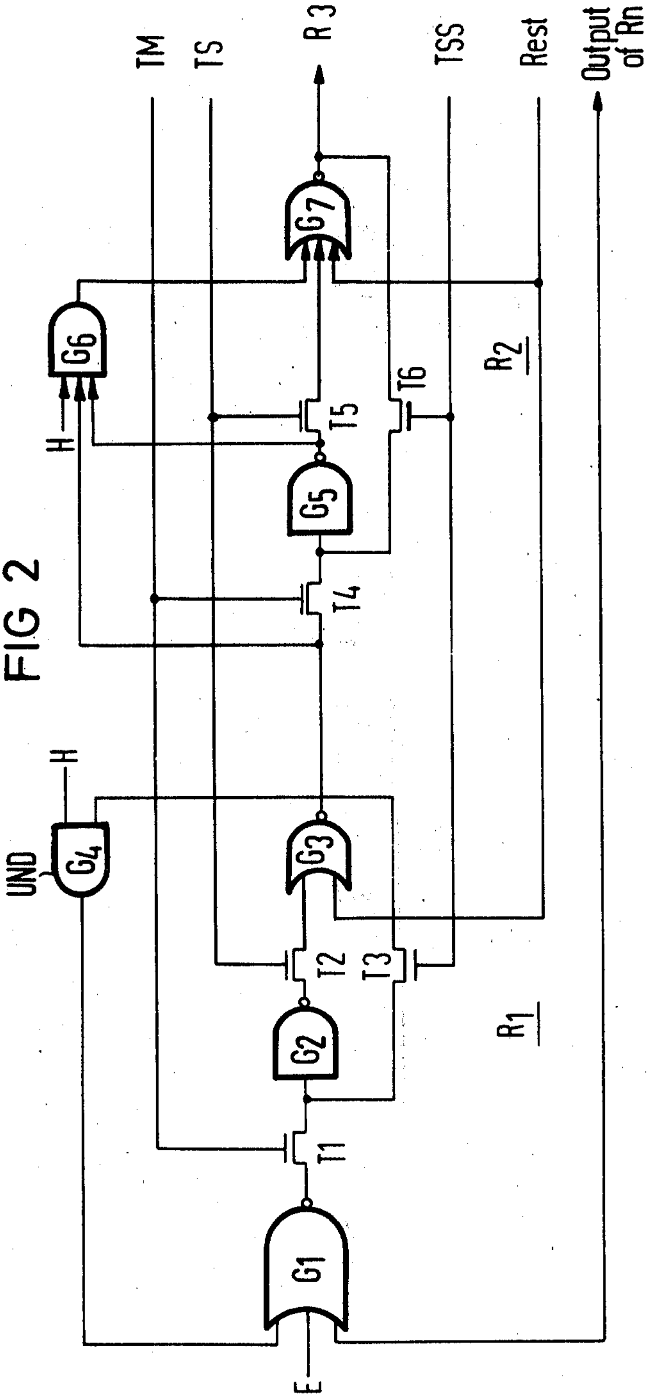

Referring now to the drawing and first, particularly to FIGS. 1 and 2 thereof, there is shown a ring shift register RR which need not necessarily form part of the semiconductor circuit according to the invention in every instance, however. Nevertheless, it is important in many cases, especially when the invention is used for musical purposes.

The ring shift register RR shown in FIG. 1 is made up of n seriesconnected register cells $R_i$, the index i covering the numbers 1, 2,–n. In the interest of circuit simplification, the individual shift register cells $R_i$ are formed as quasi-static register cells, as is evident from FIG. 2.

The information which is received, for example by means of the keyboard of an electronic organ, is delivered through the signal input E, to one input of an OR gate OG, another input of which, simultaneously receives a feedback from the last register cell $R_n$ to the first register cell $R_1$, the output of the OR gate OG being connected to an AND gate UG having an output which accordingly drives the first register cell $R_1$. A second input of the AND gate UG is controlled by an output of the second register cell $R_2$. For this purpose, this output of the second register cell $R_2$ is connected through a negating AND gate (NAND gate) NG to the second input of the AND gate UG.

The effect of this feedback of the output of a succeeding register cell to the input of a preceding register cell is that the input of the preceding register cell, i.e., register cell $R_1$ in the case of FIGS. 1 and 2, receives ONE signal only when the output of the succeeding register cell, i.e., the register cell $R_2$ in the case of FIGS. 1 and 2, carries a ZERO.

If necessary, an auxiliary signal H applied to the second input of the NAND gate NG can also block the AND gate UG and thus inhibit the input of a signal present at the signal input E or remaining from the feedback from the last register cell $R_n$ to the first register cell $R_1$.

It is readily apparent that the hereinaforedescribed connection between the output of the registr cell $R_2$ to the AND gate UG and the register cell $R_1$ has the effect that, when a ONE is present at the output of the register cell $R_2$, a ONE at the output of the last register cell $R_n$ for transmission through the OR gate OG is suppressed, i.e., separated from the information content circulating in the ring shift register RR, so that a correction of the circulating signal thus becomes possible by the elimination of an undesired ONE. Such a feedback may also be provided, if required, between other register cells $R_i$.

In FIG. 1, there is shown additionally a second possibility of modifying a signal circulating in the ring shift register RR, which is to be applied as an alternative to the correction possibility just described hereinabove. This modification possibility is provided by an AND gate U* having an output connected to a reset input R* of the second register cell $R_2$ and having a first input connected to the signal input of the first register cell $R_1$, while the second input thereof is controlled by an auxiliary signal H, when required. This AND gate U* can be caused to transmit a ONE to the reset input R* of the register cell $R_2$ only when a ONE is present at the input of the first register cell $R_1$ and a corresponding auxiliary signal H is simultaneously present at the second input of the AND gate U*. But when this is the case, a ONE simultaneously present in the register cell $R_2$ is erased. As already mentioned hereinbefore, so-called quasi-static register cells are preferably used for the register cells $R_1$, $R_2$,–$R_n$. They permit the layout of the shift register cells $R_1$ and $R_2$ as shown in FIG. 2, which are then followed by the register cells $R_3$, $R_4$,–$R_n$. Up to now, the foregoing description has remained limited to the construction of the ring shift register RR which is preferably to be used as signal input and which, if applicable, may be identical with the shift register SR serving to drive the logic circuit which is yet to be described.

The signal input E of the ring shift register RR, to be acted upon by the keyboard of, for example, an electronic organ is connected, in the embodiment according to FIG. 2, to one input of a NOR gate $G_1$ having three inputs, of which the second input is connected to the signal output of the last register cell $R_n$ and the third input is connected to the output of an AND gate $G_4$ to be switched by an auxiliary signal H.

The output of the first NOR gate (negated OR gate) $G_1$ extends, through a transfer transistor $T_1$, controlled by a clock TM, to an inverter $G_2$ and, through the latter and a second transfer transistor $T_2$, to the first input of a second NOR gate $G_3$, the second transfer transistor $T_2$ being controlled by a clock TS. Furthermore, the input of the inverter $G_2$ is connected to the output of the second NOR gate $G_3$ through a third transfer transistor $T_3$. A clock TSS is provided for control of the third transfer transistor $T_3$.

The output of the second NOR gate $G_3$ forms the output of the first register cell $R_1$. It is also connected to the first input of the previously mentioned AND gate $G_4$ which is returned to the first NOR gate $G_1$.

The second gate register cell $R_2$ includes an input transfer transistor $T_4$, controlled by the clock TM, and an AND gate $G_6$ equipped with three inputs, one of the inputs thereof being connected to the output of the first register cell $R_1$. The source-drain path of the input transfer transistor $T_4$ extends, on the one hand, through the source-drain path of another transfer transistor $T_6$ controlled by the clock TSS to the signal output of the second register cell $R_2$ and, on the other hand, through the series connection of an inverter $G_5$ and a transfer transistor $T_5$ controlled by the clock TS to one input of a NOR gate $G_7$.

This NOR gate $G_7$ has three inputs, one of which is controlled through the inverter $G_5$, the second of which by the output of the AND gate $G_6$ mentioned in the preceding paragraph, and the third of which by a reset signal. This reset signal is additionally connected to the second input of the previously mentioned output gate $G_3$ of the first register stage which, in contrast to the gate $G_7$, has only two inputs.

A difference between the second and the first register cell is also evident with respect to the two AND gates $G_4$ and $G_6$, inasmuch as the AND gate $G_6$ of the second register cell $R_2$ is equipped with three inputs and has an output provided for the co-control of the NOR gate $G_7$ which forms the output of the second register cell $R_2$. The third input of the gate $G_6$ is controlled by the clock signal TS.

The construction or layout of the register cells $R_3$ to $R_n$ is essentially the same as that of the two cells $R_1$ and $R_2$. They are, in other words, also quasi-static register cells.

The signal received through a transfer transistor controlled by the clock TM from the preceding register cell arrives, through an inverter and another transfer transistor controlled by the clock TS, at the input of a NOR gate which simultaneously forms the output of the respective cell. Furthermore, the output of the TM clock-controlled input transfer transistor of the respective register cell $R_i$, i.e., its drain, is connected directly to the signal output of the NOR gate of the respective cell. Another input of this NOR gate serves for the application of reset pulses. Finally, an AND gate corresponding to the AND gate of the register cell $R_2$ may be provided.

The embodiment of a ring shift register RR as shown in FIG. 2 is also capable of performing, in a manner similar to the arrangement according to FIG. 1, a correction of undesired binary combinations in the signal fed-in, such as occurs, for example, when adjacent keys of the organ keyboard are depressed simultaneously, and is capable of feeding a corrected signal to the actual system according to the invention.

In the case where the invention is applied to an electronic musical instrument, 12 notes (C,C sharp, D,D sharp, etc.) and the intervals between the notes are governing. In such a case, at least 12 register cells $R_i$ should be provided for the ring shift register RR which is to be energized serially, as well as for the shift register SR which serves to control the logic circuit. The digital signals, produced or generated by means of the keyboard, reach the ring shift register RR through the input E, and the information already circulating in the ring shift register RR remains intact, except for the signal components suppressed due to the corrective measures described hereinbefore.

Figure 3:
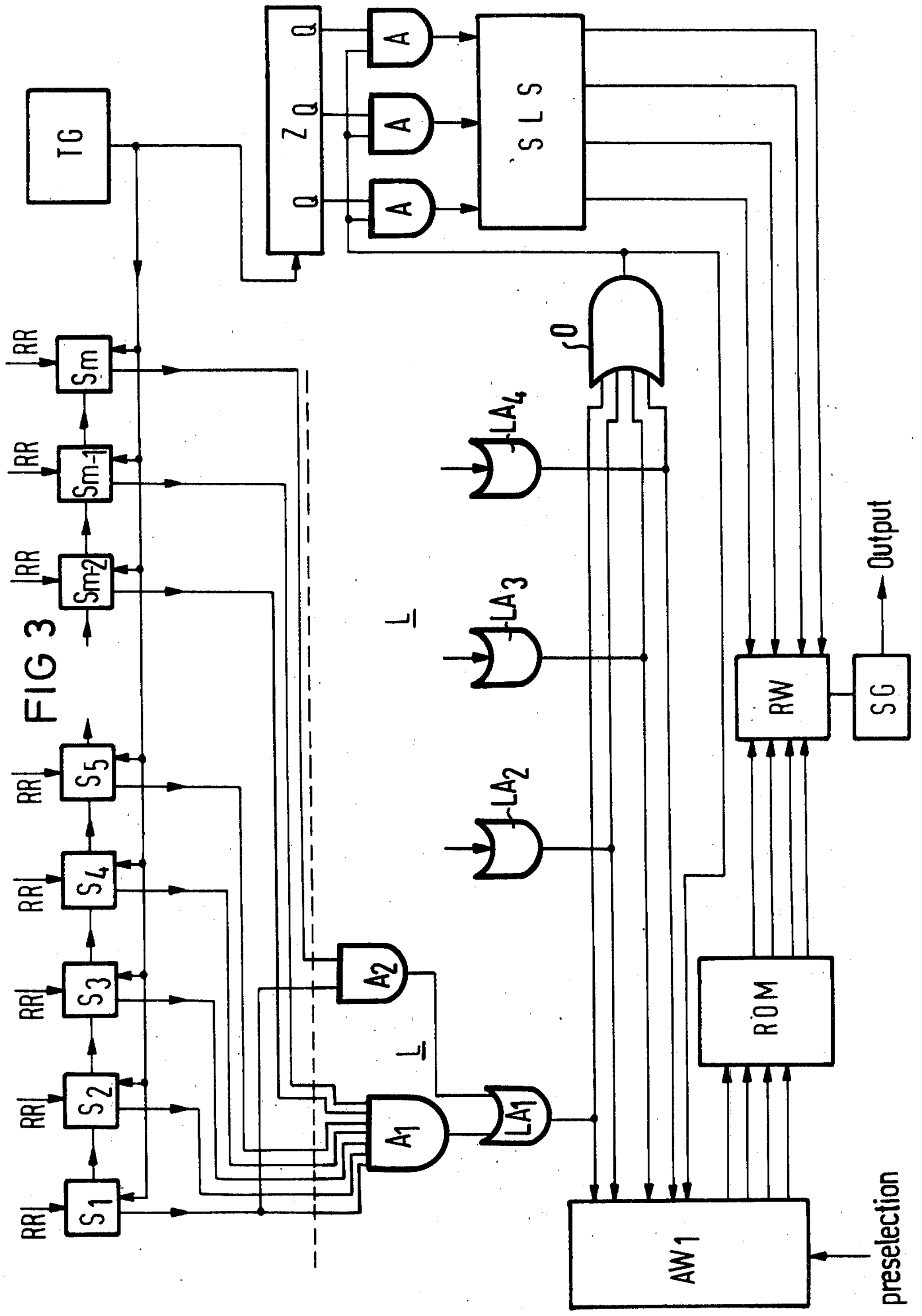
FIG. 3 is a block diagram of the remainder of the semiconductor circuit according to the invention.

The semiconductor circuit illustrated in FIG. 3 forms the core of the invention. It is described in greater detail hereinafter.

A shift register SR, preferably controlled, in parallel operation therewith, by a ring shift register RR according to FIG. 2 or FIG. 1 or by a shift register identical therewith, forms the input of the circuit shown in FIG. 3. Information contained in this shift register SR, like information in the shift register RR, must also be erased before operations are started, which is accomplished by a reset signal furnished by a clock generator common to both. A clock generator according to U.S. Pat. No. 4,293,780; entitled Digital Integrated Semiconductor Circuit, may be used, for example, as a clock generator suited to furnish the clock pulse sequences TM, TS, and TSS. The waveform of the clock signals TM, TS, and TSS is also disclosed in the aforementioned U.S. Pat.

Figure 4:
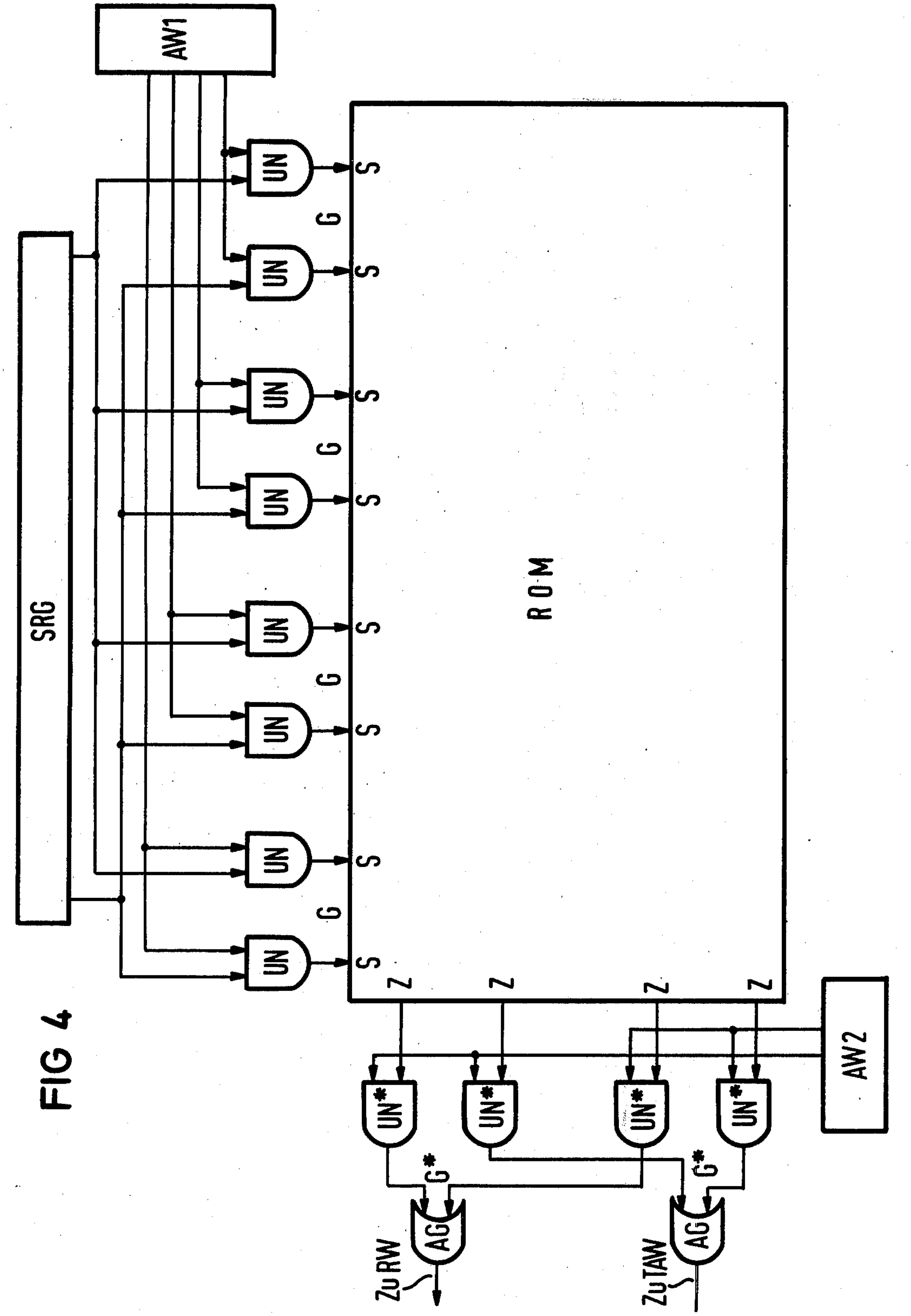
FIG. 4 is a block diagram of a system serving to generate possibly required signals for linkage or regeneration.

It should be noted further that the cells of the shift register SR in FIG. 3 and of the shift register SRG in FIG. 4 are also expediently constructed as quasi-state register cells. All of these cells as well as the other circuit components provided in an arrangement according to the invention are advantageously constructed in MOS-IC technology.

The output of two register cells $S_i$ of the shift register SR and, in the preferred case, the outputs of all register cells $S_i$ are connected to the signal masking logic circuit L, while the individual register cells $S_i$ receive their information in parallel through the respectively associated register cell $R_i$ of the ring shift register RR.

It is the task of the logic circuit driven by the shift register SR, based upon the information respectively reaching the shift register SR, to control additionally a digital counter, such as a binary counter Z, especially, which is controlled by the shift clock pulses of the shift register SR as counting pulses, the fixing of this count being provided for in accordance with the setting and the construction. The determining factor therefore is the task to be performed by the semiconductor circuit so that the function and, hence, the construction of the logic L can be of varying conventional types.

In the embodiment illustrated in FIG. 3, each of the outputs of the individual register cells $S_i$ of the shift register SR is connected to one input of the logic circuit L. The logic circuit L is formed in a conventional manner of elementary gates, in particular AND gates, OR gates, NAND gates, NOR gates, inverters or exclusive OR gates in order to realize the desired logic function. Often the internal wiring of the logic circuit L is constructed or laid out so that a signal for fixing the count of the binary counter Z appears at the output of the logic circuit only in the presence of a certain signal in the shift register SR.

In the embodiment according to FIG. 3, the signal output of the first register cell $S_1$ and the signal outputs of all other register cells $S_i$, except for the last register cell $S_m$, are connected in such a manner to a respective input of an AND gate $A_1$ that the AND gate $A_1$ is controlled by the cells $S_1$ to $S_{m-1}$ and consequently, a ONE appears at the output of the AND gate $A_1$ only upon the simultaneous appearance of a ONE at the outputs of these shift register cells $S_1$ to $S_{m-1}$, which are constructed, as noted hereinbefore, as quasi-static shift register cells. Furthermore, the output of the first register cell $S_1$ and the output of the last register cell $S_m$ are applied to a respective one of the two inputs of another AND gate $A_2$. The outputs of the two last-mentioned AND gates $A_1$ and $A_2$ are connected to a respective one of the two inputs of an intermediate gate $LA_1$, such as an OR gate, which forms a secondary output of the logic circuit L, provided for the control of an auxiliary system such as the system shown in FIG. 4.

If the task to be performed by the total system should so require, the logic circuit L can contain more gates. However, the description of details in this regard is not disclosed herein because they are unimportant for the invention and a detailed description thereof for a concrete case would take too much space. Suffice it to note that appropriate logic gates or structures are provided for the AND gates $A_1$ and $A_2$ and that they are addressed in appropriately different ways by the shift register SR. The output of these various substructures is respectively provided again by intermediate gates $LA_2$, $LA_3$, and so forth, which, in turn, can be utilized as secondary outputs for various tasks.

In the case of the illustrated embodiment, the main output of the logic circuit L is an OR gate D, the individual inputs of which are controlled by a respective one of the intermediate gates $LA_1$ of the logic circuit L. This main output serves for fixing the count of a digital counter, i.e., the pulse counter z, in the manner described hereinabove.

The clock generator TG provided for the timed control of the shift register SR, which serves for driving the logic circuit L and, if applicable, also the ring shift register RR, transmits the clock pulses serving for timing the shift register SR at the same time to the counting input of a binary counter Z having Q-outputs which are each applied to the first input of an AND gate A, the other input of which is controlled by the main output of the logic circuit L, i.e., by the output of the OR gate G. The result of the use of an OR gate D as the output of the logic circuit L is that the count of the binary counter Z is fixed, i.e., transmitted as a signal through the AND gates A whenever there appears at one of the intermediate gates $LA_1$ a signal of possible importance to the rest of the system for synchronization purposes. On the other hand, other cases are conceivable wherein the construction of the output of the logic circuit L is called for in the form of an AND gate or a NOR gate.

The count of the binary counter Z, fixed by the action of the AND gates, is introduced, in the case of the illustrated embodiment, into a write/read memory SLS in order to be used, if applicable, elsewhere in the semiconductor circuit also. Moreover, this fixed count is applied to the inputs serving to drive an arithmetic unit RW such as an adder, either by directly connecting the outputs of the AND gates A or indirectly through the write/read memory SLS.

On the other hand, the secondary outputs of the logic circuit L, given by the intermediate gates $LA_i$, are provided for the control of an auxiliary circuit, such as a selecting circuit $AW_1$ having the purpose of activating a system which furnishes the additional signals still required for the arithmetic linkage in the arithmetic unit. This system, referred to as ROM, is shown in FIG. 4. Finally, the result obtained when the arithmetic unit RW is addressed, serves to control additional components of the system such as a signal generator SG.

Further provided in the device shown in FIG. 4 for the generation of the linking signals to be supplied to the arithmetic unit RW in addition to the count of the binary counter Z is a read-only memory ROM which is loaded i.e. programmed, in the respectively required manner, and which is constructed as a matrix memory, in addition.

Each column circuit S of this ROM, constructed in a conventional manner, is connected to the signal output of a respective AND gate UN. These AND gates UN are divided into groups G of equal size, each being assigned to one of the signal outputs of the previously mentioned first selection circuit $AW_1$ controlled by the intermediate gates $LA_i$ of logic circuit L. For example, four such groups G are provided, each containing eight AND gates UN.

The first selection circuit $AW_1$ is set by the logic circuit L, as evident from FIG. 3. To accomplish this, there may be provided, in the selection circuit $AW_1$, another logic circuit which is activated by the secondary outputs of the logic circuit L and ensures that one certain output of the selection circuit $AW_1$ gets the ONE level, while the other outputs retain the ZERO level. If the number of inputs of the selection circuit $AW_1$ controlled by the logic circuit L, i.e., through the secondary outputs of the latter and if applicable, also through the main output O thereof, is the same as the number of the outputs thereof and, hence, the number of groups G, it suffices that each $AW_1$ input controlled by the logic circuit L controls a respective preselector-activated AND gate, through the output of which a respective flip-flop e.g. RS flip-flop, is set. The flip-flop node not activated by the AND gate then forms one output each of the selector $AW_1$.

The AND gates UN of the individual groups G are controlled by the output of the first selection circuit $AW_1$ respectively assigned to them in that one of the two inputs of each AND gate UN of the respective group G is connected to the output of the selection circuit $AW_1$ assigned to this group. An additional shift register SRG, particularly one supplied by the clock generator TG, serves as the control of the second inputs of each AND gate UN. Provisions are made for a number of register cells of this shift register SRG (possibly also constructed as a ring) matching the number of AND gates UN in the individual groups G to be assigned to all groups G jointly in that only a single AND gate UN of each group G is controlled by each of these register cells, with each AND gate UN being assigned to only one register cell each. With this, a correlation of the column circuits of the ROM with the individual register cells is achieved by actuating the selection circuit $AW_1$. For example, if a signal consisting only of a ONE is put into the shift register SRG, it depends on the position of the selection circuit, on the one hand, and on the number of clock shift signals given to the shift register after putting in the ONE, on the other hand, as to which parts of the ROM are activated.

The read-out of information from the ROM goes through the row lines Z which are respectively connected to the input of one AND gate UN* each. The total number of these AND gates UN* is divided, similar to the number of AND gates UN, into groups G*, which are respectively controlled by an output of a second selection circuit $AW_2$, each containing the same number of AND gates UN*. While the one input of the individual AND gate UN* is controlled by the line circuit Z assigned to it, the other input thereof is connected to the output of the second selection circuit $AW_2$ assigned to the respective group.

Furthermore, a number of identical output gates AG, matching the number of AND gates UN* in the individual groups G* and each having a number of logic inputs matching the number of groups G* is provided. The signal outputs of these output gates AG serve for activating the arithmetic unit RW of the arrangement shown in FIG. 3.

In the embodiment shown in FIG. 4, the output gates AG are OR gates with two inputs each. The second selection circuit $AW_2$ may likewise be controlled by a logic circuit such as the logic circuit L. In the event the circuit is applied to the construction of an electronic organ, however, a manually controlled selection circuit $AW_2$ will be preferred. Its task then appropriately becomes a control task related to the playing rhythm, for example.

The signal-generating system SG, controlled by the arithmetic unit RW, may be formed by a memory, particularly one constructed as a read-only memory, to be driven by the output signals of the arithmetic unit RW.

The semiconductor circuit shown in FIGS. 1 to 4 is suited, among other things, for the identification of the playing status respectively present in the keyboard of an electronic organ and for automatic generation of the accompaniment appropriate to the melody being played. To accomplish this, the signal transmitted by the keyboard in the form of digital pulses is stripped in the ring shift register RR of signal components not desired respecting the generation of the accompaniment, and the musical key is recognized through the logic circuit L, and the figures of accompaniment appropriate for the respectively recognized key are recalled from the read-only memory ROM, filtered through the second selection circuits $AW_2$ in accordance with the desired or played rhythm, and the corresponding control information is given to the arithmetic unit RW.

On the other hand, the fundamental note present in the signal respectively contained in the shift register SR is determined by the respectively fixed state of the binary counter Z so that not only the key, but also the associated fundamental note is put into the signal required for the control of the signal generating system SG. It is the task of this signal to generate, through a digitally controlled tone generator, the respectively required chord of accompaniment.

As is a common practice in other digital circuits, an automatic reset to the initial state is associated with the turn-on of the system, as already indicated in connection with the discussion hereinabove with respect to FIG. 2. This applies in particular to the shift registers RR, SR, and SRG as well as to the binary counter Z. But even while the system is in operation, a reset may be required, particularly one occurring at periodic intervals. It is generally constructed in accordance with the aspects applying to the overall system, of which the semiconductor circuit according to the invention is generally only a part.

We claim:

1. A monolithically integrable semiconductor circuit having an input section into which respective electrical signals which are to be evaluated and which have been provided by groups of binary pulses are serially feedable, comprising a clock-controlled shift register in the input section having a plurality of register cells corresponding in number at least to the number of binary digits of the groups of binary pulses, a logic circuit, at least two of said register cells having an output operatively connected to said logic circuit for controlling said logic circuit, said shift register being operatable by shift pulses from the controlling clock thereof, a pulse counter driven by said shift pulses as counting pulses, said logic circuit having an output operatively connected to said pulse counter for latching the count thereof, and at least one other circuit component controllable by the count of said pulse counter respectively latched by control of said logic circuit, said input section further comprising an input circuit including a clock-controlled ring shift register as principal component and having an input to which information in the form of one of the digital pulse groups is applicable, said information being transferable serially from said input to said ring shift register as well as in parallel from said ring shift register to said first-mentioned shift register operatively connected to said logic circuit for controlling the said logic circuit, said ring-shift register in said input circuit having a plurality of register cells, the number of which as well as the number of register cells in said first-mentioned shift register operatively connected to said logic circuit corresponding, respectively, at least to the maximum number of digital places of the signals being evaluated, said register cells of said ring-shift register in said input circuit being serially connected in a chain thereof and having respective outputs, and including a logic gate, the output of at least one of said register cells of said ring-shift register being connected through said logic gate to one of the inputs to the respective register cells located ahead of the output of said at least one register cell in said chain of register cells.

2. A semiconductor circuit according to claim 1 wherein said other circuit component is a read/write memory.

3. A semiconductor circuit according to claim 1 wherein said other circuit component is an arithmetic unit.

4. A semiconductor circuit according to claim 1 wherein the register cells of at least one of said ring shift register in said input circuit and said first-mentioned shift register operatively connected to said logic circuit are constructed as quasi-static shift register cells.

5. A semiconductor circuit according to claim 1 wherein said other circuit component includes another clock controlled shift register, and further comprising a clock generator for delivering three different clock sequences closely associated with one another with respect to the phase condition thereof for clocking said first-mentioned shift register operatively connected to said logic circuit, said ring-shift register in said input circuit and said other shift register of said other circuit component.

6. A semiconductor circuit according to claim 5 wherein one of the register cells serially connected in said ring-shift register of said input circuit has a signal input connected to one input of an AND gate, said AND gate having a second input for an auxiliary signal for controlling said AND gate and also having an output, another register cell succeeding said one register cell in said ring-shift register of said input circuit having a reset input, said output of said AND gate being connected to said reset input.

7. A semiconductor circuit according to claim 1 wherein one of the register cells serially connected in said ring-shift register of said input circuit has an output, and including a NAND gate having two inputs and an output and being controllable by an auxiliary signal applicable to one of said two inputs thereof, said output of said one register cell in said ring shift register being connected to the other input of said NAND gate, said output of said NAND gate being connected through an AND linkage to an input of a register cell preceding said one register cell in said ring-shift register.

8. A semiconductor circuit according to claim 1 wherein said register cells of said ring-shift register in said input circuit are serially connected in, and including an OR gate having two inputs and an output, one of said two inputs of said OR gate being the signal input of said ring-shift register, and the other of said two inputs being connected to the output of the last of the register cells serially connected in said ring-shift register for controlling the first register cell in said ring-shift register, said output of said OR gate being operatively connected to the input of said first register cell.

9. A semiconductor circuit according to claim 8 including an AND gate, said output of said OR gate being connected to the input of said first register cell indirectly through said AND gate.

10. A semiconductor circuit according to claim 1 wherein the first register cell of said serially connected register cells of said ring-shift register has an input connected thereto through a NOR gate having three inputs, one of said three inputs being connected to the signal input to said ring-shift register, and AND gate controllable by the output of said first register cell and by an auxiliary signal having an output connected to another of said three inputs of said NOR gate, the last register cell of said serially connected register cells of said ring-shift register having a signal output connected to the third of said three inputs of said NOR gate.

11. A semiconductor circuit according to claim 1 wherein said logic circuit has a combination of at least two AND gates each having at least one input and respective outputs, and an intermediate gate forming a secondary output of said logic circuit, at least part of the signal output of said shift register controlling said logic circuit being applied to a respective input of said combination of at least two AND gates, said outputs of said AND gates being combined through said intermediate gate.

12. A semiconductor circuit according to claim 11 wherein remaining parts of the signal output of said shift register are applied to respective inputs of combinations of other AND gates, respectively, and said AND gates have outputs combined through other intermediate gates, and including an output gate forming the main output of said logic circuit, said intermediate gates being combined through said output gate.

13. A semiconductor circuit according to claim 12 wherein said output gate is an OR gate.

14. A semiconductor circuit according to claim 11 wherein said intermediate gate comprises an OR gate.

15. A semiconductor circuit according to claim 12 wherein said binary pulse counter has count-transmitting outputs and, jointly with said shift register is controlled by said controlling clock, said other circuit component comprising an arithmetic unit driven by said count-transmitting outputs through an AND gate controllable by said logic circuit.

16. A semiconductor circuit according to claim 15 including a write/read memory through which said arithmetic unit is driven by said count-transmitting outputs.

17. A semiconductor circuit according to claim 15 including a read-only memory constructed as a matrix memory having a plurality of column circuits each of which is connected to a signal output of a respective AND gate all of the AND gates being divided into groups of equal size, each of said groups of AND gates being assigned to a respective signal output of a first signal selection circuit settable by said logic circuit, and including an additional clock-controlled shift register for having a digital signal applied thereto and comprising a plurality of register cells corresponding in number to the number of AND gates in the respective groups of AND gates and being connected to a respective AND gate of each of said groups of AND gates in a manner that only one AND gate in each of said groups of AND gates is responsive when the respective register cell is actuated by a corresponding signal passing therethrough.

18. A semiconductor circuit according to claim 17 wherein said read-only matrix memory has a plurality of row circuits each of which is connected to a signal output of a respective additional AND gate, all of the additional AND gates being divided into additional groups of equal size, each of said additional groups of additional AND gates being assigned to a respective signal output of a second signal selection circuit, said additional AND gates combined in a group thereof having another input connected to a corresponding signal output of said second signal selection circuit, and including a plurality of identical output gates corresponding in number to the number of additional AND gates in the respective additional groups of said additional AND gates, said output gates having a plurality of signal inputs corresponding in number to the number of said additional groups of additional AND gates, a respective signal input of said output gates being connected to the output of the respective additional AND gate of each of said additional groups of said additional AND gates.

19. A semiconductor circuit according to claim 18 wherein said output gates are connected to said arithmetic unit to which the count fixed through said logic circuit is simultaneously applied.

20. A semiconductor circuit according to claim 18 wherein said output gates are constructed as OR gates.

21. A semiconductor circuit according to claim 18 wherein said first mentioned shift register, said ring shift register and said additional shift register are formed of quasi-static register cells.

* * * * *